(12) United States Patent
Choi (10) Patent No.: US 11,987,884 B2
(45) Date of Patent: May 21, 2024

(54) GLASS AND WAFER INSPECTION SYSTEM AND A METHOD OF USE THEREOF (71) Applicant: JNK TECH, San Jose, CA (US)

(72) Inventor: Youngjin Choi, San Jose, CA (US)

(73) Assignee: JNK TECH, San Jose, CA (US)

(*) Notice: Subject to any disclaimer, the term of this patent is extended or adjusted under 35 U.S.C. 154(b) by 154 days.

(21) Appl. No.: 17/345,795

(22) Filed: Jun. 11, 2021

(65) Prior Publication Data
US 2022/0230927 A1 Jul. 21, 2022

Related U.S. Application Data (60) Provisional application No. 63/175,282, filed on Apr. 15, 2021.

(51) Int. Cl.
| C23C 16/52 | (2006.01) |
| G01N 21/88 | (2006.01) |
| G01N 21/95 | (2006.01) |
| G01N 21/958 | (2006.01) |
| G06T 1/00 | (2006.01) |
| G06T 7/00 | (2017.01) |
| G06T 7/13 | (2017.01) |
| G06T 7/174 | (2017.01) |

(Continued)

(52) U.S. Cl.
CPC ......... *C23C 16/52* (2013.01); *G01N 21/8851* (2013.01); *G01N 21/9501* (2013.01); *G01N 21/958* (2013.01); *G06T 1/0014* (2013.01); *G06T 7/0004* (2013.01); *G06T 7/13* (2017.01); *G06T 7/174* (2017.01); *H01L 21/681* (2013.01); *H01L 22/12* (2013.01); *G06T 2207/30148* (2013.01)

(58) Field of Classification Search
CPC ................ C23C 16/52; G01N 21/8851; G01N 21/9501; G06T 1/0014
See application file for complete search history.

(56) References Cited

U.S. PATENT DOCUMENTS

| 6,215,897 B1 | 4/2001 | Beer et al. |
| 6,324,298 B1 | 11/2001 | O'Dell et al. |

(Continued)

FOREIGN PATENT DOCUMENTS

| KR | 10-2017-0015209 A | 2/2017 |
| WO | WO 2022/220920 A1 | 10/2022 |

OTHER PUBLICATIONS

Notice of Allowance Mailed on Oct. 4, 2023 for U.S. Appl. No. 18/048,164.

(Continued)

*Primary Examiner* — Hai Y Zhang
(74) *Attorney, Agent, or Firm* — Knobbe, Martens, Olson & Bear, LLP (57) ABSTRACT A method of inspection and an inspection system for the film deposition process for substrates includes glass and wafer. The inspection system includes multiple camera modules positioned in a load lock unit of a process chamber, such as the camera modules that can capture images of the substrate in the load lock. The images are analyzed by a control unit of the inspection system to determine the accuracy of robots in handling the substrate, calibration of the robots based on the analysis, and defects in the substrate caused during the handling and deposition process.

4 Claims, 10 Drawing Sheets (51) Int. Cl.
  *H01L 21/66* (2006.01)
  *H01L 21/68* (2006.01)

(56) References Cited

U.S. PATENT DOCUMENTS

| | | | |
|---|---|---|---|
| 7,634,365 | B2 | 12/2009 | Steele et al. |
| 9,269,923 | B2 | 2/2016 | Choi et al. |
| 9,449,809 | B2 | 9/2016 | Choi et al. |
| 10,043,641 | B2 | 8/2018 | Choi et al. |
| 11,286,567 | B1 | 3/2022 | Choi |
| 11,508,590 | B2 | 11/2022 | Choi |
| 2002/0127852 | A1 | 9/2002 | Kawakami et al. |
| 2003/0167612 | A1 | 9/2003 | Kraus et al. |
| 2005/0031187 | A1 | 2/2005 | Lin et al. |
| 2005/0045821 | A1 | 3/2005 | Noji et al. |
| 2008/0144922 | A1 | 6/2008 | Naiki |
| 2008/0292811 | A1 | 11/2008 | Choi et al. |
| 2010/0151688 | A1 | 6/2010 | Choi et al. |
| 2011/0142572 | A1 | 6/2011 | Blonigan et al. |
| 2011/0188733 | A1 | 8/2011 | Bardos et al. |
| 2011/0311339 | A1 | 12/2011 | Yasui et al. |
| 2012/0013899 | A1 | 1/2012 | Amanullah |
| 2012/0112068 | A1 | 5/2012 | Maeda et al. |
| 2014/0264296 | A1 | 9/2014 | Choi et al. |
| 2015/0254827 | A1* | 9/2015 | Kobayashi .............. G06T 7/001 348/130 |
| 2017/0032510 | A1 | 2/2017 | Francken et al. |
| 2018/0366357 | A1 | 12/2018 | Liao et al. |
| 2019/0057890 | A1 | 2/2019 | Sato |
| 2019/0096730 | A1 | 3/2019 | Morita et al. |
| 2021/0005487 | A1 | 1/2021 | Tsai et al. |
| 2021/0097675 | A1 | 4/2021 | Koga et al. |
| 2021/0305074 | A1 | 9/2021 | Wang |
| 2022/0051380 | A1 | 2/2022 | Jin et al. |
| 2022/0230927 | A1 | 7/2022 | Choi |
| 2022/0333248 | A1 | 10/2022 | Choi |
| 2022/0336239 | A1 | 10/2022 | Choi |
| 2023/0187238 | A1 | 6/2023 | Choi |

OTHER PUBLICATIONS

International Search Report in Application No. PCT/US2022/016551 dated May 31, 2022.
Written Opinion in Application No. PCT/US2022/016551 dated May 31, 2022.
Office Action in corresponding U.S. Appl. No. 18/048,164 issued on Apr. 13, 2023.
Notice of Allowance dated Jul. 22, 2022 for U.S. Appl. No. 17/647,332.
Office Action in corresponding U.S. Appl. No. 17/647,332 issued on Mar. 29, 2022.
Office Action in U.S. Appl. No. 17/305,838 dated Nov. 10, 2021.
Notice of Allowance in U.S. Appl. No. 17/305,838 dated Jan. 24, 2022.
Office Action in U.S. Appl. No. 17/656,343 dated Oct. 14, 2022.
Notice of Allowance in U.S. Appl. No. 17/656,343 dated Aug. 4, 2023.
Chen, Yi-Cheng, Yu-Pin Chen, and Ju-Yi Lee. "Experimental results of a wafer positioning system using machine vision after system calibration." 2012 Proceedings of SICE Annual Conference (SICE). IEEE, 2012. (Year: 2012).

* cited by examiner

| System ID: AAABBBCCC | | | | Glass In | | Daye: yy/mm/dd Time : hh -mm -ss | | | | | | |
|---|---|---|---|---|---|---|---|---|---|---|---|---|
| Glass ID: ######AAABBBCCC | | | | Glass Out | | UL | UR | | LL | | LR | |
| 88.8 | 55.5 | C & D : ## | C & D : ## | 55.5 | 88.8 | UL | Active | Alarm | Warm | Value | set min | set max | Result | Unit |
| 55.5 | Real time view UL | | Real time view UR | | 55.5 | X-axis | ☐ | ■ | ☐ | 4.1 | 3.0 | 5.0 | OK | m/m |
| OK | | | | | OK | Y-axis | ☐ | ■ | ☐ | 3.8 | 3.0 | 5.0 | OK | m/m |
| | | | | | | C & D | ☐ | ■ | ☐ | 130 | 1 | 300 | OK | μm |
| NG | LL Real time view | | LR Real time view | | NG | Corner | ☐ | ■ | ☐ | 75 | 65 | 90 | OK | n/a |
| | | | | | 55.5 | Edge-1 | ☐ | ■ | ☐ | 0.6 | 0.1 | 0.4 | NG | m/m |
| 88.8 | 5.5 | C & D : # | C & D : ## | 5.5 | 88.8 | Edge-2 | ☐ | ■ | ☐ | 0.5 | 0.1 | 0.4 | NG | m/m |

C & D : Crack and Defect on glass

ATM Glass Loader

Set | Copy | Review | Manual | Close
E-log | Load | Save

GLASS AND WAFER INSPECTION SYSTEM AND A METHOD OF USE THEREOF

CROSS-REFERENCE TO RELATED APPLICATIONS

This application claims priority to the U.S. provisional patent application Ser. No. 63/175,282, filed on Apr. 15, 2021, which is incorporated herein by reference in its entirety.

FIELD OF INVENTION

The present invention relates to a glass and wafer inspection system, and more particularly the present invention relates to a camera-based inspection system and a method for inspecting film deposition process for glass and wafers.

BACKGROUND

Glasses and wafers referred to hereinafter as a substrate, are coated with a variety of coatings to enhance their mechanical, chemical, optical, electric, magnetic, or other properties. Typically, one or more thin films are deposited on the substrate by one of several known processes, such as chemical vapor deposition (CVD) is a common process for depositing thin films on substrates. The deposition process is conducted in special chambers, such as PECVD or PVD chambers. Robots are used to handle the glass in and out of the chambers without any human intervention. The deposition process is generally monitored for any defects, such as chipping, break, spot/stain etc. can be detected with known vision systems. However, the known inspection methods have several limitations. The deposition process is prone to several kinds of defects which cannot be detected by known inspection systems. Moreover, the known inspection systems cannot recognize the substrate location in the process chamber and a lot of other process parameters.

There currently exists an industry need for an inspection system that can detect defects in both the substrate processing and the processing parameters.

SUMMARY OF THE INVENTION

The following presents a simplified summary of one or more embodiments of the present invention in order to provide a basic understanding of such embodiments. This summary is not an extensive overview of all contemplated embodiments and is intended to neither identify key or critical elements of all embodiments nor delineate the scope of any or all embodiments. Its sole purpose is to present some concepts of one or more embodiments in a simplified form as a prelude to the more detailed description that is presented later.

The principal object of the present invention is therefore directed to an inspection system for substrates that is devoid of the aforesaid drawback and limitation of the prior art systems.

It is another object of the present invention that the inspection system can recognize the glass location in a process chamber.

It is still another object of the present invention that the inspection system can recognize the fixture status on the substrate.

It is yet another object of the present invention that the inspection system can recognize the sagging of big size electrodes in the process chamber.

It is still another object of the present invention that the inspection system can detect substrate breakage, crack, stain, or spot.

It is a further object of the present invention that the inspection system can detect transfer robot performance with glass position data.

In one aspect, disclosed is a method of inspection and an inspection system for film deposition process for substrates includes glass and wafer. The inspection system includes multiple cameras positioned in a load lock unit of the deposition chamber, such as the cameras can capture the substrate in the load lock.

In one aspect, the cameras are coupled to a control unit, wherein the control unit is configured to analyze the images obtained from the camera for defects in the deposition process and the process itself including breakage, crack, stain or spot, transfer robot performance with glass position data, fixture alignment status with analysis of film edge line, and electrode sagging with film analysis of corner area.

In one aspect, disclosed is a method for analyzing the film with different reflectiveness and refractiveness of induced light in the camera module.

In one aspect, disclosed is a method for corner film profile analysis that can check susceptor/electrode flatness, arc generation, and the assembling status of substrate fixtures (S/F).

In one aspect, disclosed is a method for evaluating the accuracy and precision of the transfer robot in the substrate loading and unloading.

These and other objects and advantages of the embodiments herein and the summary will become readily apparent from the following detailed description taken in conjunction with the accompanying drawings.

BRIEF DESCRIPTION OF THE DRAWINGS

The accompanying figures, which are incorporated herein, form part of the specification and illustrate embodiments of the present invention. Together with the description, the figures further explain the principles of the present invention and to enable a person skilled in the relevant arts to make and use the invention.

DETAILED DESCRIPTION

Subject matter will now be described more fully hereinafter with reference to the accompanying drawings, which form a part hereof, and which show, by way of illustration, specific exemplary embodiments. Subject matter may, however, be embodied in a variety of different forms and, therefore, covered or claimed subject matter is intended to be construed as not being limited to any exemplary embodiments set forth herein; exemplary embodiments are provided merely to be illustrative. Likewise, a reasonably broad scope for claimed or covered subject matter is intended. Among other things, for example, the subject matter may be embodied as methods, devices, components, or systems. The following detailed description is, therefore, not intended to be taken in a limiting sense.

The word "exemplary" is used herein to mean "serving as an example, instance, or illustration." Any embodiment described herein as "exemplary" is not necessarily to be construed as preferred or advantageous over other embodiments. Likewise, the term "embodiments of the present invention" does not require that all embodiments of the invention include the discussed feature, advantage, or mode of operation.

The terminology used herein is for the purpose of describing particular embodiments only and is not intended to be limiting of embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

The following detailed description includes the best currently contemplated mode or modes of carrying out exemplary embodiments of the invention. The description is not to be taken in a limiting sense but is made merely for the purpose of illustrating the general principles of the invention, since the scope of the invention will be best defined by the allowed claims of any resulting patent.

Figure 1:
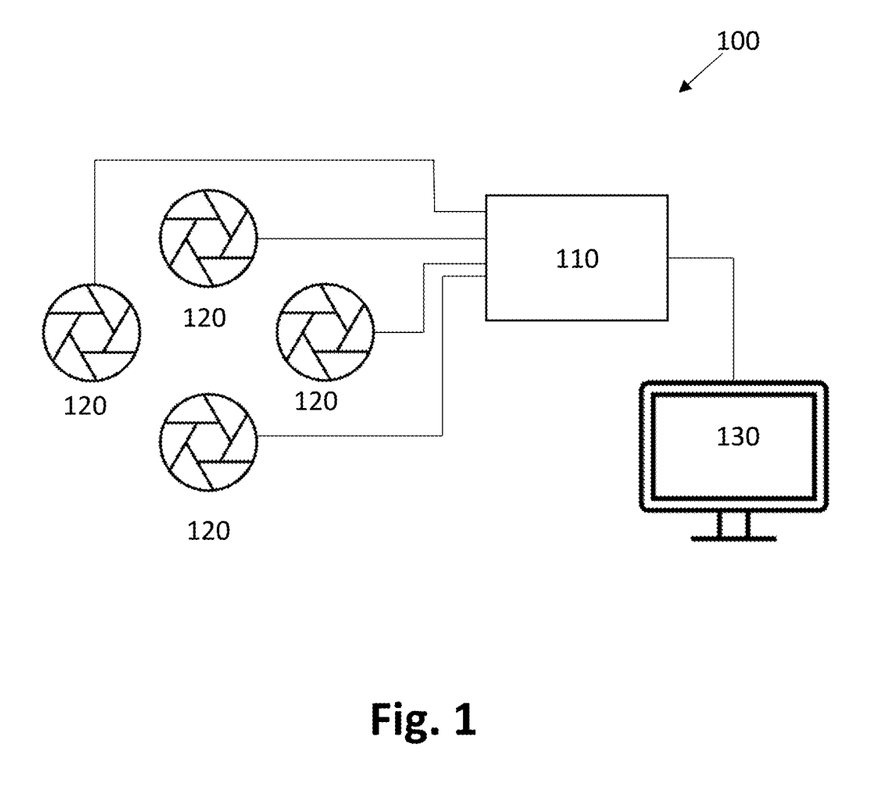
FIG. 1 is a block diagram showing the disclosed inspection system, according to an exemplary embodiment of the present invention.

Referring to FIG. 1 disclosed is an inspection system that can be used for monitoring the thin film deposition process in a deposition chamber for substrates including glass and wafer. The inspection system 100 can include a control unit 110 that can be connected to several camera modules 120 that can be installed in the substrate load lock unit of the process chamber, also referred to hereinafter as a load lock. The control unit can control the camera modules. For example, the control unit can be connected to the control unit of the process chamber to detect steps of the operation, such as glass loading, and based on the input from the process chamber can control the activation of camera modules. The control unit 110 can also be connected to a display 13, wherein the control unit can provide an interface on the display graphically presenting different parameters of the inspection and the identified values of the parameters.

Figure 2:
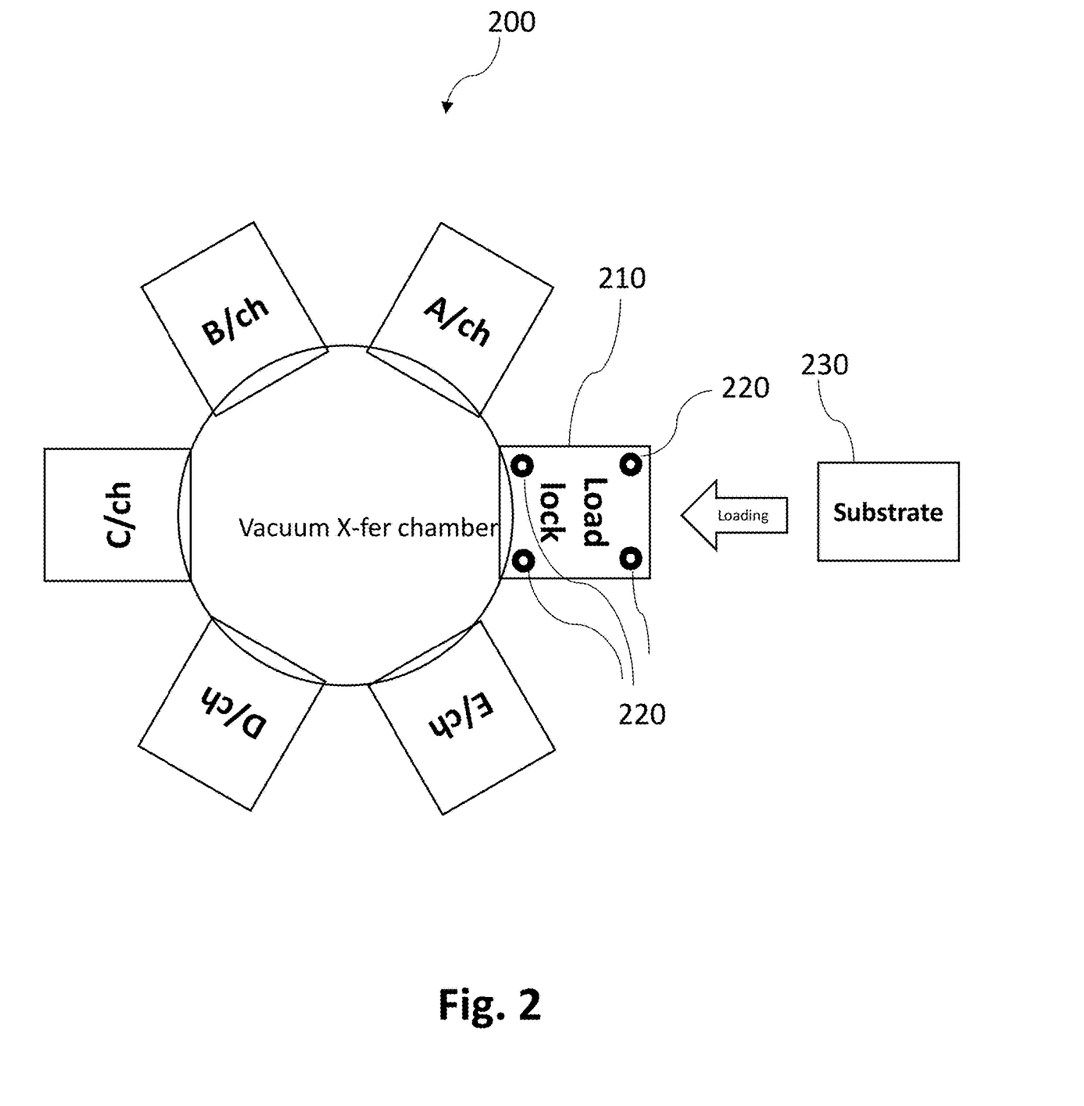
FIG. 2 shows an exemplary embodiment of the arrangement of camera modules of the inspection system, according to an exemplary embodiment of the present invention.

Referring to FIG. 2 which shows an exemplary embodiment of the process chamber 200 for thin film deposition or coating on a substrate, such as glass or wafer. The process chamber 200 can have a substrate load lock unit or chamber that can receive the substrate 230. FIG. 2 shows the substrate load lock unit 210 as a part of the process chamber 200. The substrate load lock unit 210 can have a front door to receive substrate 230. Another door separates the processing modules from the load lock 210. Robotic arms (not shown) having substrate fixtures can move the substrate into and from the substrate load lock unit 210. The substrate is generally not directly introduced in the process modules but the load lock. The process modules are the vacuum chambers in which the deposition processes like sputtering, electron beam evaporation, or thermal evaporation take place. Load locks are secondary vacuum chambers that are connected to a process module, separated by a gate valve, and have their own high vacuum pump down and vent control.

The cameras can be positioned in or adjacent to the load locks to capture the handling and status of the substrate before and after the processing. FIG. 2 shows Four camera modules 220 mounted to the load lock 210 for capturing images of the substrate in the load lock 210. All the four camera modules 220 can be in electrical communication with the control unit. It is to understand that FIG. 2 shows four camera modules, however, two or more camera modules are within the scope of the present invention.

Figure 3:
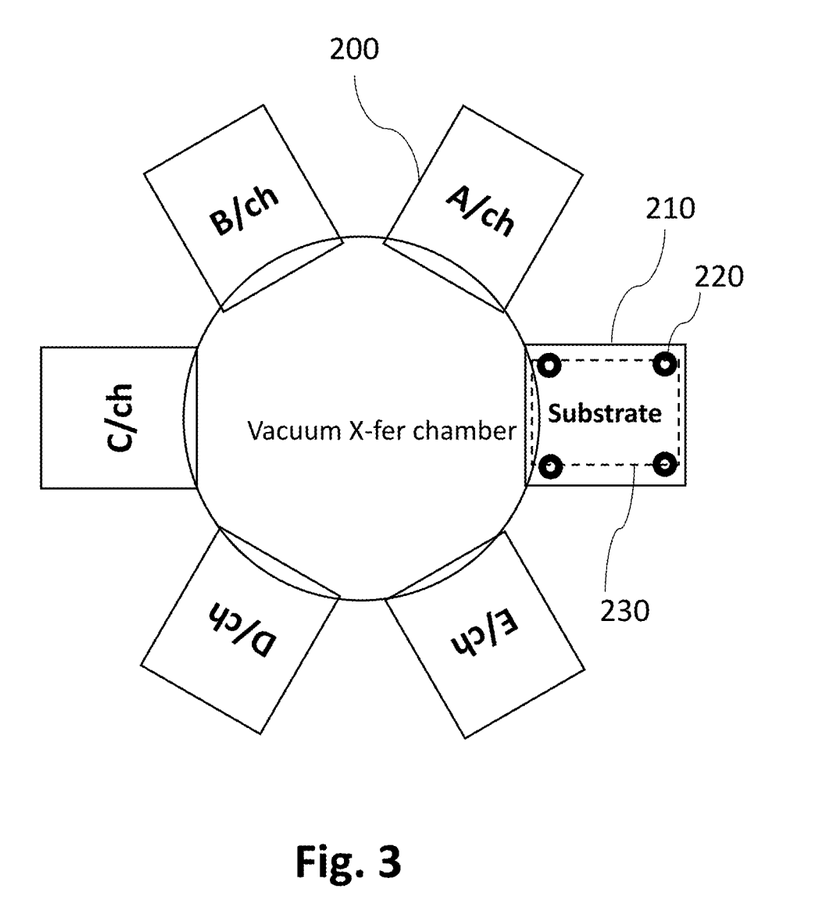
FIG. 3 shows the substrate loaded in a substrate loading chamber, according to an exemplary embodiment of the present invention.
Figure 4:
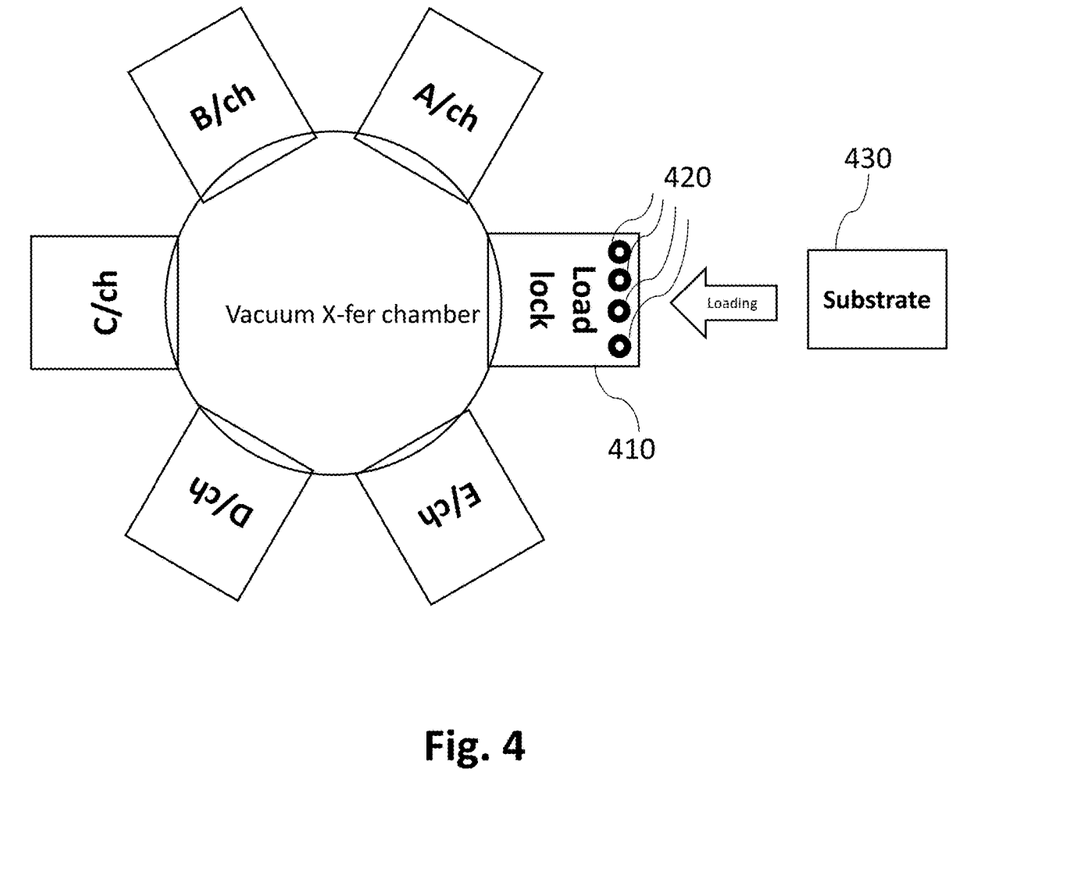
FIG. 4 shows a different arrangement of the camera modules of the inspection system, according to an exemplary embodiment of the present invention.

A robot can transfer a new substrate 230 into the load lock 210, the first door of the load lock 210 can be opened to receive the substrate into the load lock 210. Typically, the robot can extend the arm to deliver the substrate 230 into the load lock 210 and lowers the substrate onto support pins in the load lock 210 and the arm can then be retracted. Upon receiving the substrate and removal of the arm, the first door can be closed. Thereafter, the load lock 210 tries to pump down to get the base vacuum level, which conventionally takes about 20 or 30 secs. During the pumping down in the glass loading chamber, the control unit can trigger the four camera modules to capture images of the substrate in the load lock 210. The images can be analyzed for the position of the substrate in the load lock 210. FIG. 3 shows the substrate 230 in the load lock 210 and the position of the four camera modules 220 can be relative to the substrate 230. The arrangement of the camera modules in the load lock 210 and relative to the substrate 230 can be changed without departing from the scope of the present invention. For example, FIG. 4 shows the four camera modules 420 linearly arranged at the entrance of the load lock 410 and relative to the substrate 430. An alternative embodiment of the arrangement of the four camera modules can be seen in FIG. 5 wherein the four camera modules 520 are still arranged linearly but positioned differently near the entrance of the load lock 510 and relative to the substrate 530. The arrangement of the four camera modules as shown in FIG. 2 can be a preferred embodiment, however, a skilled person will appreciate that the position and arrangement of the four camera modules can be optimized based on the process parameters.

Figure 6:
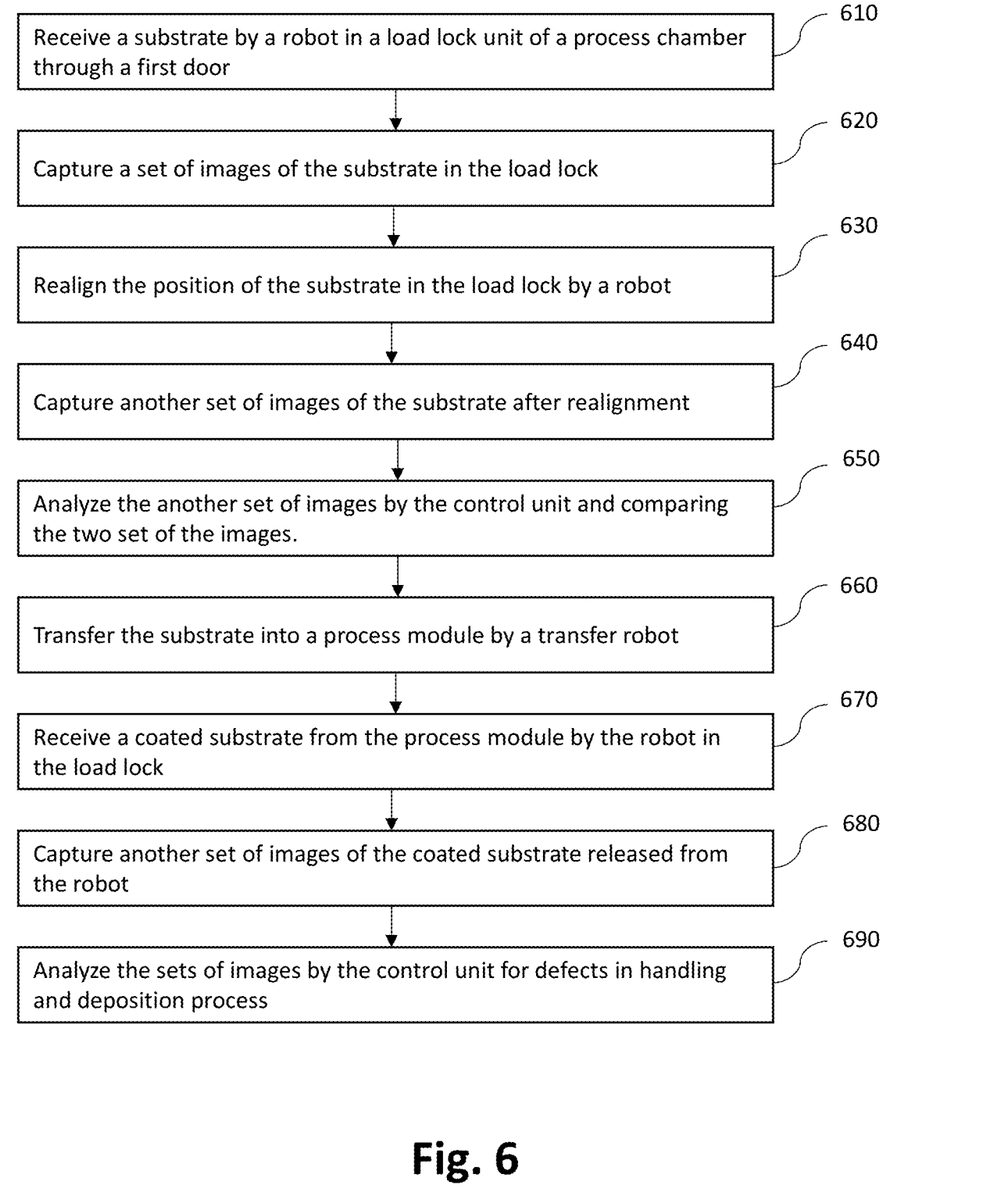
FIG. 6 is a flow chart showing the disclosed method of inspecting the substrate coating process, according to an exemplary embodiment of the present invention.

Referring to FIG. 6 which is a flow chart showing an exemplary embodiment of the method of monitoring the substrate coating process in a process chamber. First, a substrate can be received by a robot in a substrate load lock unit of the process chamber, at step 610. The robot can release the substrate in the load lock on support pins and get retracted from the load lock. The control unit can trigger the camera modules to capture the images of the substrate in the load lock rested on the support pins, at step 620. Images captured at this stage can be useful in determining the accuracy and precision of the robot in handling the substrate. A robot typically handles the substrate four times in the load lock i.e., receiving the substrate, transferring the substrate to the process modules, receiving from the process modules, and transferring outside the process chamber. Clamping of the substate by the robot can also damage the substrate or coating on the substrate. The images captured at step 620 can also be used to track the defects in the substrate caused by clamping. The image can be received by the control unit and using the predefined rules, the control unit can analyze the images to detect inspect any damage, scratch, stain on the substrate. The position of the substrate in the load lock can also be used to check the accuracy of the robot and do any calibrations if needed.

The next stage can be wherein the robot can realign the position of the substrate in the load lock if required by shifting or sliding the substrate within the load lock, at step 630. The new position of the substrate after realignment by the robot can be captured by the camera modules, at step 640. The images captured at step 640 can be analyzes to measure the displacement of the substrate and detect any defect resulted from the clamping, at step 650. The analysis can be made by comparing the images captured at step 640 with the images captures at step 620. After receiving the substrate at step 610, the load lock generally pumps the air to create a vacuum. Upon completion of the pumping, the door of the transfer chamber side can be open, and the transfer chamber robot arm can pick the substrate for transferring to the process modules, at step 660. The film deposition process can be carried out in the process modules. Once the deposition process is complete, the substrate can be moved to the load lock, at step 670. The transfer robot can deliver the substrate in the load lock and retract. In the load lock, the camera modules can take another set of images of the substrate, ats step 680. This set of images can be used to analyze the accuracy of the transfer robot in positioning the substrate in the load lock, ats step 690. Moreover, the set of images can also be analyzed to inspect the substrate for scratches, cracks, or abnormal plasma. Any displacement of the substrate by the robot can again be inspected using another set of images captured. After clamping, another set of images can be captured by the camera modules. Comparing the image set after clamping with the image set just before clamping can reveal any errors in the handling, such as any crack or scratch by clamping. The analysis can be done by the control unit which can receive the set of the images captures by the camera modules.

The final set of images captured of the coated substrate i.e., after the film deposition process, the set of images can be analyzed by the control unit for any defects in the deposition process. For example, the control unit can analyze the film condition at the corner areas. If there is a gap between the electrode of the ground side and the glass fixture, there should be an unclear edge line and different film densities at the corner area. The control unit can be equipped with suitable algorithms to detect the susceptor/electrode flatness, Arc generation, assembling status of substrate fixture(S/F) using the corner film profile. The control unit can further analyze substrate fixture sitting status and the robot's accuracy and precision at different stages in handling the substrate.

Figure 5:
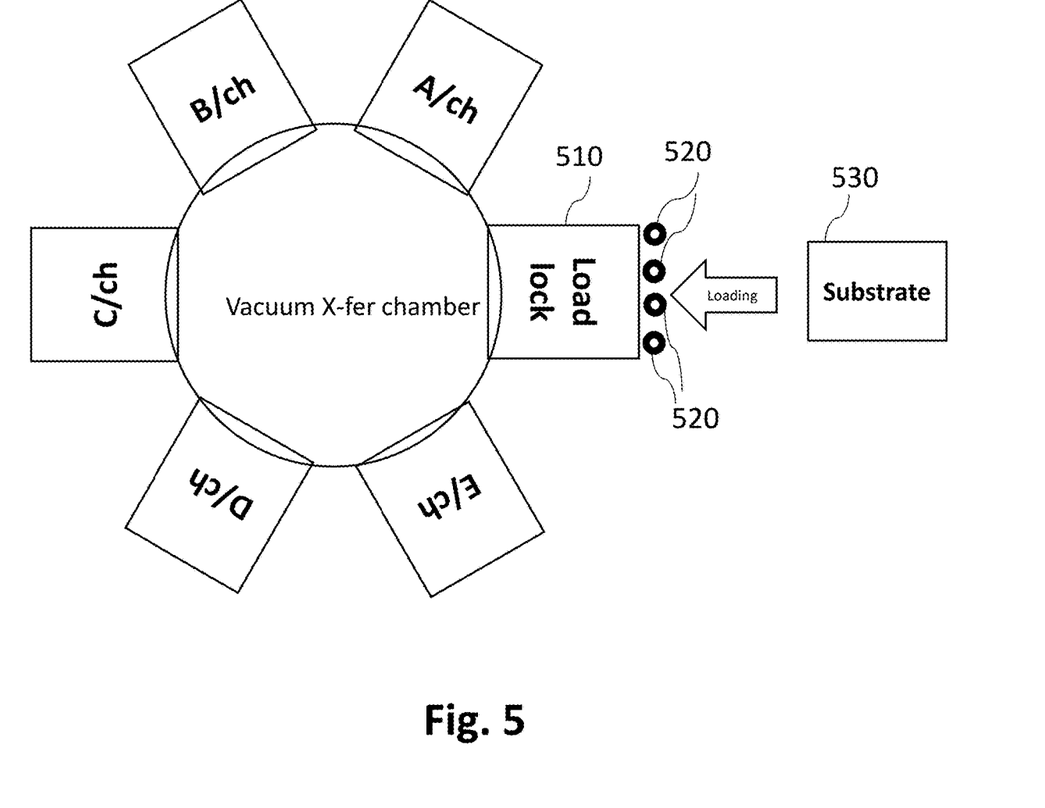
FIG. 5 shows yet another arrangement of the camera modules of the inspection system, according to an exemplary embodiment of the present invention.
Figure 7:
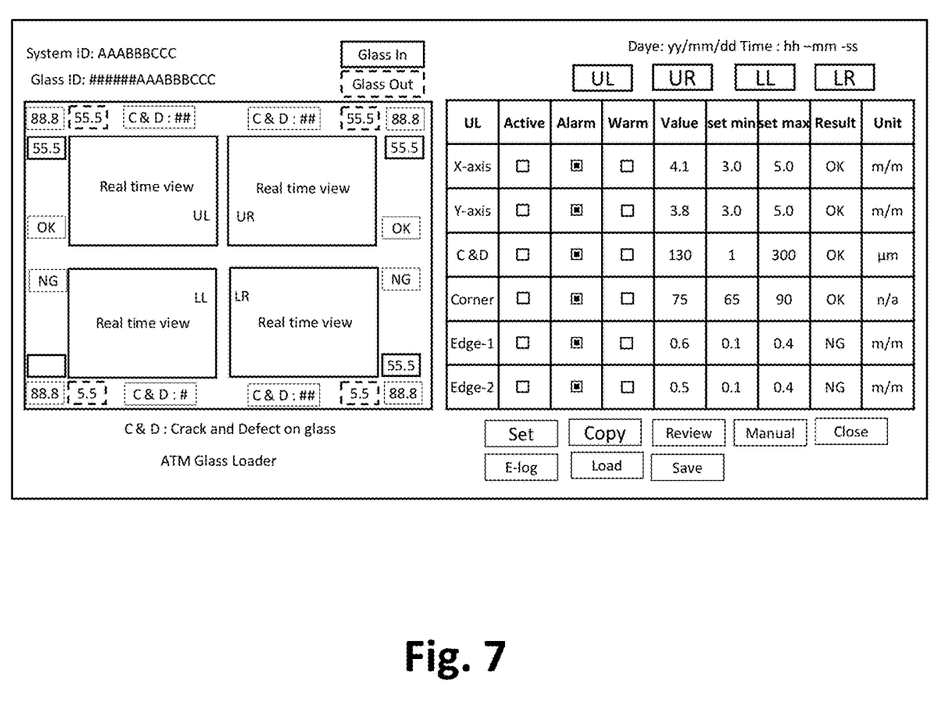
FIG. 7 shows the interface provided by the control unit on the display, according to an exemplary embodiment of the present invention.

Referring to FIG. 7, the control unit can be connected to a suitable display and an interface can be provided by the control unit on the display for monitoring the status of the substrate before and after the deposition process. The interface can be an interactive interface that may allow a user to interact with the system to determine and inspect different parameters, defining thresholds. The interface can include multiple frames for displaying the images. FIG. 5 shows four frames that can show the processed images of the upper left, upper right, lower left, and the lower right of the substrate. On the right side can be seen different parameters for the substrate. Thresholds including the min and max can be provided for desired parameters. The user can see the parameters for either upper left, upper right, lower left, and the lower right, wherein clickable tabs can be provided to switch between windows presenting the parameters for the upper left, upper right, lower left, and the lower right. FIG. 7 shows the clickable tabs in the upper right position.

Figure 8:
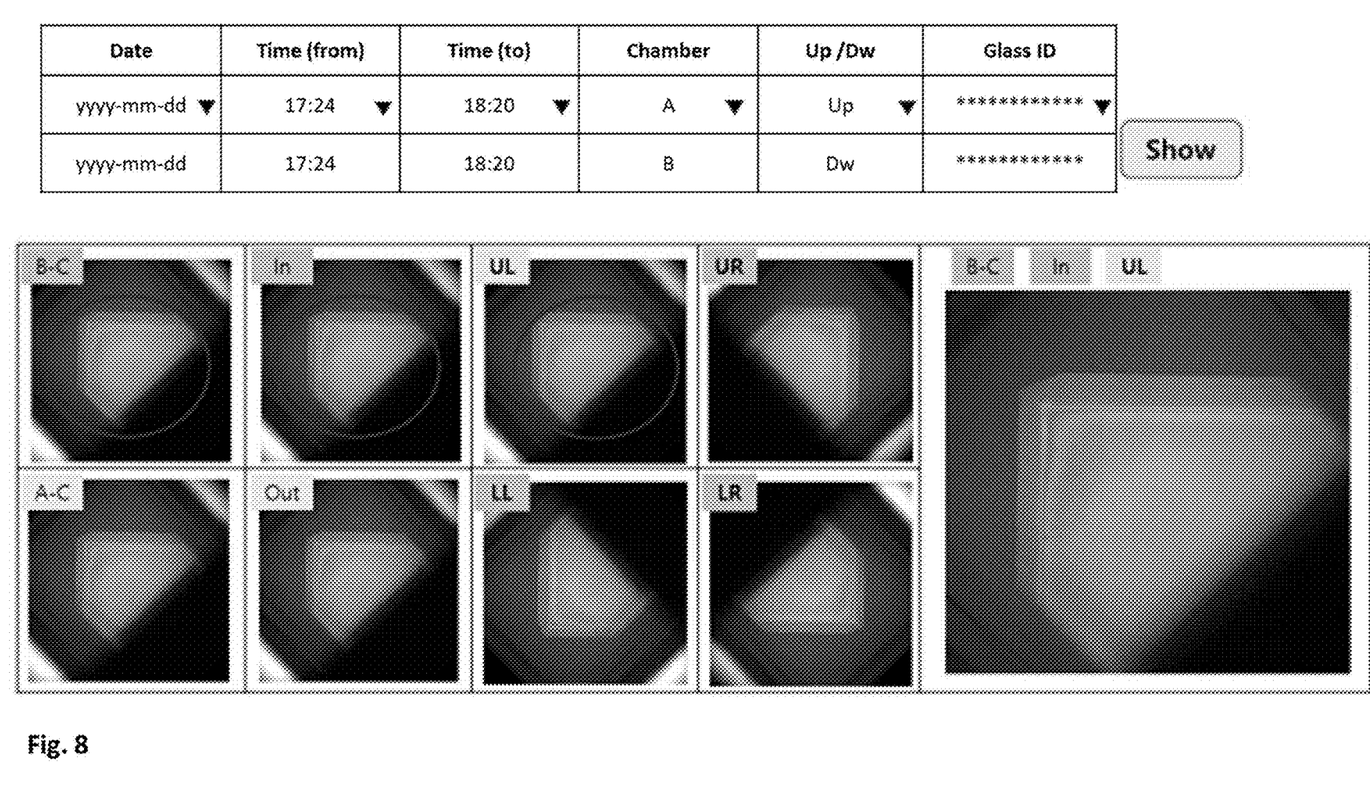
FIG. 8 shows an exemplary embodiment of the interface having a frame for images, according to an exemplary embodiment of the present invention.
Figure 9:
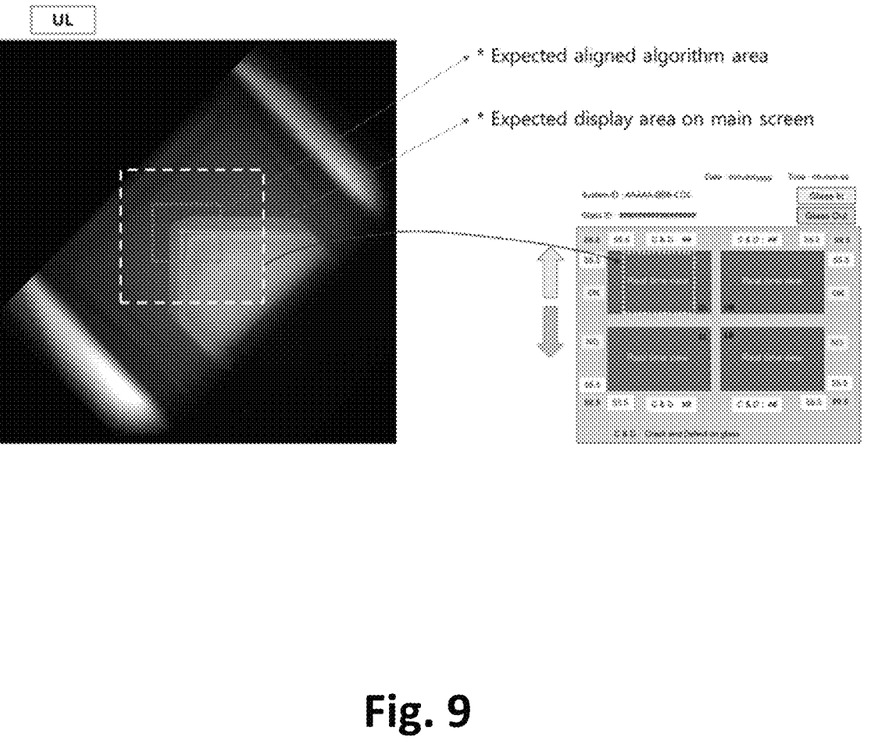
FIG. 9 shows an image for corner profile analysis and the frame view of the image as displayed on the interface of FIG. 6, according to an exemplary embodiment of the present invention.
Figure 10:
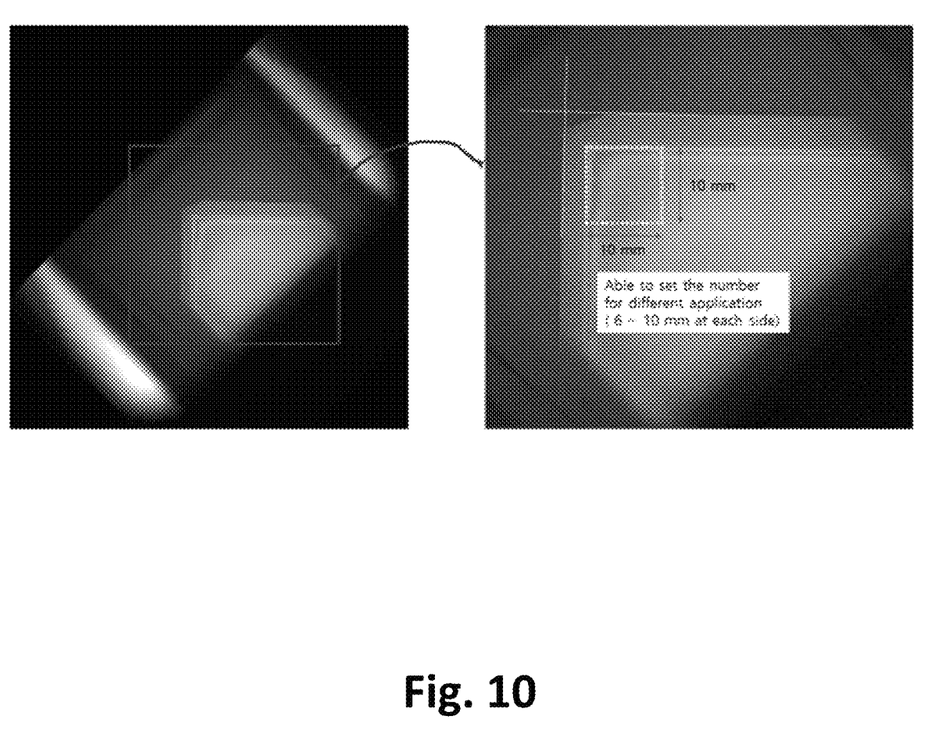
FIG. 10 shows an exemplary embodiment of analyzing an image for corner analysis profile, according to an exemplary embodiment of the present invention.

Referring to FIG. 8 which shows the set of images captured for the corner profile analysis. The interface can provide options to view the image set of desired time duration and stage of different process modules. The user can navigate through the list and select an entry to view the images and related parameters. FIG. 9 illustrates how the control unit can process the image using the predefined rules and algorithms and display a section of the image in the frame of the main interface shown in FIG. 7. FIG. 10 shows how to set thresholds for the corner profile analysis.

While the foregoing written description of the invention enables one of ordinary skill to make and use what is considered presently to be the best mode thereof, those of ordinary skill will understand and appreciate the existence of variations, combinations, and equivalents of the specific embodiment, method, and examples herein. The invention should therefore not be limited by the above-described embodiment, method, and examples, but by all embodiments and methods within the scope and spirit of the invention as claimed.

What is claimed is:

1. A method for inspecting a substrate coating process, the method comprising the steps of:
   providing a plurality of camera modules mounted to a load lock unit of a process chamber for coating thin film on a substrate;
   receiving, by a robot, the substrate into a load lock unit through a first door;
   upon receiving the substrate through the first door, capturing a first set of images by the plurality of camera of the substrate in the load lock unit;
   realigning the substate by a robot in the load lock unit;
   upon realigning, capturing a second set of images of the substrate by the plurality of cameras; and
   analyzing, by a control unit, the second set of images in comparison with the first set of images to obtain a first set of parameters, the first set of parameters related to the accuracy of the robots in handling the substrate and any defects in the substrate due to handling.

2. The method according to claim 1, wherein the method further comprises the steps of:
   upon realignment, transferring the substrate by a robot into a process module through a second door;
   receiving a coated substrate from the process module into the load lock unit by a robot, wherein the coated substrate is the substrate processed in the process module;
   capturing a third set of images of the coated substrate by the plurality of camera modules; and
   analysis the first, second, and third set of images to obtain values of a second set of parameters.

3. The method according to claim 2, wherein the substrate is glass.

4. The method according to claim 2, wherein the substrate is a wafer.

* * * * *